United States Patent
Tabata

(10) Patent No.: US 11,702,590 B2
(45) Date of Patent: Jul. 18, 2023

(54) LIGHT-EMITTING MATERIAL AND LIGHT-EMITTING DEVICE

(71) Applicant: NICHIA CORPORATION, Anan (JP)

(72) Inventor: Hideo Tabata, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 356 days.

(21) Appl. No.: 17/049,841

(22) PCT Filed: Apr. 24, 2019

(86) PCT No.: PCT/JP2019/017488
§ 371 (c)(1),
(2) Date: Oct. 22, 2020

(87) PCT Pub. No.: WO2019/208655
PCT Pub. Date: Oct. 31, 2019

(65) Prior Publication Data
US 2021/0253946 A1 Aug. 19, 2021

(30) Foreign Application Priority Data
Apr. 25, 2018 (JP) .................................. 2018-083818

(51) Int. Cl.
| | | |
|---|---|---|
| *C09K 11/02* | (2006.01) | |
| *C09K 11/88* | (2006.01) | |
| *H01L 33/50* | (2010.01) | |
| *B82Y 20/00* | (2011.01) | |
| *B82Y 40/00* | (2011.01) | |

(52) U.S. Cl.
CPC ............ *C09K 11/025* (2013.01); *C09K 11/02* (2013.01); *C09K 11/883* (2013.01); *H01L 33/502* (2013.01); *B82Y 20/00* (2013.01); *B82Y 40/00* (2013.01)

(58) Field of Classification Search
CPC ..... C09K 11/025; C09K 11/02; H01L 33/502; B82Y 20/00; B82Y 40/00
See application file for complete search history.

(56) References Cited

U.S. PATENT DOCUMENTS

| | | | |
|---|---|---|---|
| 2004/0250745 A1 | 12/2004 | Ogura et al. | |
| 2018/0345638 A1* | 12/2018 | Smith | C09K 11/025 |
| 2019/0148614 A1* | 5/2019 | Iwasa | H01L 35/16 |
| | | | 136/201 |

FOREIGN PATENT DOCUMENTS

| | | |
|---|---|---|
| CN | 107353889 A | 11/2017 |
| JP | 2004-300253 A | 10/2004 |
| JP | 2017-032995 A | 2/2017 |

OTHER PUBLICATIONS

Erdem et al., "Stable and efficient colour enrichment powders of nonpolar nanocrystals in LiCl", Nanoscale, 2015, pp. 17611-17616, vol. 7, The Royal Society of Chemistry 2015.
Otto et al., "Colloidal Nanocrystals Embedded in Macrocrystals: Robustness, Photostability, and Color Purity", Nano Letters, 2012, pp. 5348-5354, vol. 12, 2012 American Chemical Society.
Taniguchi et al., "A Versatile Surface Design to Disperse Nanoparticles in Ionic Liquids and Organic Solvents", Chemistry Letters, 2016, pp. 898-900, vol. 45, 2016 The Chemical Society of Japan.

* cited by examiner

*Primary Examiner* — C Melissa Koslow
(74) *Attorney, Agent, or Firm* — Foley & Lardner LLP

(57) ABSTRACT

A light emitting material includes: luminescent nanoparticles; and an ionic crystal containing an anionic component represented by formula (1) below. In the formula, $R^1$ and $R^2$ each independently denote a fluorine atom or a fluoroalkyl group, or $R^1$ and $R^2$ each denote a fluoroalkylene group to be connected to each other to form a ring.

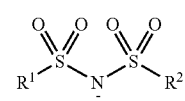

(1)

13 Claims, 6 Drawing Sheets

Prior Art

LIGHT-EMITTING MATERIAL AND LIGHT-EMITTING DEVICE

CROSS-REFERENCE TO RELATED APPLICATIONS

The present application is a U.S. National Phase of PCT Application No. PCT/JP2019/017488, filed on Apr. 24, 2019, which claims priority to Japanese Application No. 2018-083818, filed on Apr. 25, 2018. These applications are hereby incorporated by reference in their entireties.

BACKGROUND

The present disclosure relates to a light-emitting material and a light-emitting device.

Luminescent nanoparticles are characterized by high luminescent efficiency and narrow spectral half-width, and their luminescent colors are controllable over a wide wavelength region by changing their particle diameters. Such characteristics are particularly suited to be used for a high efficiency lighting with high color rendering and a display with a wide color range. Thus, luminescent nanoparticles are drawing attention as a next-generation light-emitting material. However, nanoparticles, which have a high ratio of surface area to the volume, have low chemical stability, and tend to deteriorate particularly due to, for example, water and oxygen. Thus, methods for imparting barrier properties to nanoparticles are being studied.

For example, Japanese Unexamined Patent Application Publication No. 2017-32995 (hereinafter also referred to as Patent Literature 1) describes a wavelength conversion member formed by dispersing luminescent semiconductor nanoparticles in a resin including a constitutional unit derived from an ionic liquid having a polymerizable functional group. Also, Tobias Otto et al., Colloidal Nanocrystals Embedded in Macrocrystals: Robustness, Photostability, and Color Purity, Nano Letters, Vol. 12 pp 5348-5354, 2012 (hereinafter also referred to as Non-Patent Literature 2) reports complexing CdTe nanoparticles and ionic crystals (NaCl, KCl, KBr). Further, Talha Erdem et al., Stable and efficient colour enrichment powders of nonpolar nanocrystals in LiCl, Nanoscale, Vol. 7, pp 17611-17616, 2015 (hereinafter also referred to as Non-Patent Literature 1) reports a method of complexing ionic crystals and CdSe/CdZnSeS/ZnS nanoparticles by using LiCl, which is soluble in an organic solvent, without using water.

SUMMARY

However, in the wavelength conversion member described in Patent Literature 1, which includes a resin derived from an ionic liquid incorporating luminescent semiconductor nanoparticles, the resin derived from an ionic liquid has insufficient barrier properties against gaseous components such as oxygen and water vapors contained in the air, and thus the luminescent nanoparticles may deteriorate when exposed to the atmospheric air over a long time. Also, in the light-emitting materials of Non-Patent Literature 1 and 2, both of which contain an ionic crystal incorporating luminescent nanoparticles, the ionic crystal is hygroscopic, and thus may allow water vapor to approach to the luminescent nanoparticles, causing deterioration of the luminescent nanoparticles. Further, the method described in Non-Patent Literature 1 uses water in the production process, which may cause deterioration of nanoparticles themselves during production.

An aspect of the present disclosure is directed to providing a light-emitting material containing luminescent nanoparticles and an ionic crystal with a specific structure, and being superior in environmental resistance.

A first aspect is a light-emitting material containing luminescent nanoparticles and an ionic crystal containing an anionic component represented by formula (1) below. In the formula, $R^1$ and $R^2$ each independently denote a fluorine atom or a fluoroalkyl group, or $R^1$ and $R^2$ each denote a fluoroalkylene group to be connected to each other to form a ring.

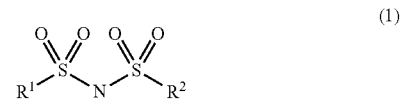

(1)

A second aspect is a light-emitting device including a light source having an emission peak wavelength in the range of from 380 nm to 485 nm, and the light-emitting material. The present embodiment includes, as other aspects, use of an ionic crystal containing an anionic component represented by formula (1) below in the production of the light-emitting material containing luminescent nanoparticles and the ionic crystal containing an anionic component represented by formula (1) below; use of an ionic crystal containing an anionic component represented by formula (1) below in improving environmental resistance of the light-emitting material containing luminescent nanoparticles and the ionic crystal containing an anionic component represented by formula (1) below; and use of the light-emitting material in producing a light-emitting device including a light source having an emission peak wavelength in the range of from 380 nm to 485 nm, and the light-emitting material.

According to an aspect of the present disclosure, a light-emitting material containing luminescent nanoparticles and an ionic crystal with a specific structure, and being superior in environmental resistance may be provided.

DETAILED DESCRIPTION

As used herein, the term "step" means not only an independent step but also a step which cannot be clearly distinguished from the other steps but that can achieve the desired object. When a plurality of substances corresponding to a component is present in a composition, the amount of the component means the total amount of the corresponding substances present in the composition unless otherwise specified. The embodiments of the present disclosure will now be described in detail; however, the embodiments described below are mere examples of the light-emitting material and so forth for embodying the technical concept of the present disclosure, and the present disclosure is not limited to the light-emitting material and so forth described below. The dimensions, materials, shapes, relative positions, for example, of the constituent members described in the embodiments are not intended to limit the scope of the present disclosure thereto, but are merely illustrative examples.

Light-Emitting Material

The light-emitting material contains luminescent nanoparticles and an ionic crystal containing an anionic component represented by formula (1) below:

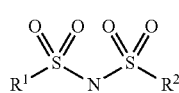
(1)

In the formula, $R^1$ and $R^2$ each independently denote a fluorine atom or a fluoroalkyl group, or $R^1$ and $R^2$ each denote a fluoroalkylene group to be connected to each other to form a ring.

By including luminescent nanoparticles and an ionic crystal containing the specific anionic component, the light-emitting material exhibits improved environmental resistance. This is probably because, for example, the ionic crystal containing the specific anionic component has a low hygroscopicity, and thus may reduce water vapors approaching the luminescent nanoparticles, and also because its crystallinity imparts barrier properties, superior to resin, to the light-emitting material against gaseous components such as vapors and oxygen contained in the air, resulting in improved environmental resistance of the light-emitting material.

The light-emitting material includes luminescent nanoparticles and an ionic crystal. The light-emitting material includes, for example, an ionic crystal at least partially incorporating the luminescent nanoparticles. The luminescent nanoparticles in the light-emitting material may be incorporated in a state where a plurality of the particles is aggregated in the ionic crystal, or the individual particles are independently incorporated in the ionic crystal.

Figure 1:
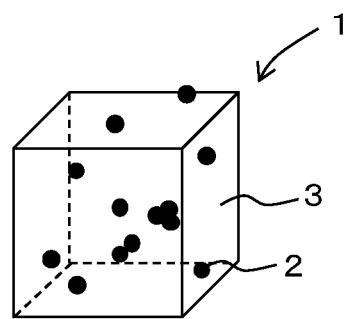
FIG. 1 is a schematic diagram of a light-emitting material containing luminescent nanoparticles and an ionic crystal.

A configuration example of the light-emitting material will now be described with reference to the drawings. FIG. 1 is a schematic diagram of an example light-emitting material containing luminescent nanoparticles and an ionic crystal. The light-emitting material 1 includes an ionic crystal 3 incorporating luminescent nanoparticles 2. In FIG. 1, the luminescent nanoparticles 2 are incorporated in the ionic crystal 3 in the form of single particles or aggregated particles. Some of the luminescent nanoparticles 2 are partially exposed from the crystal faces of the ionic crystal. For the sake of simplicity, the luminescent nanoparticles 2 are spherical in FIG. 1, but the luminescent nanoparticles are not necessarily spherical. Also, although the ionic crystal 3 is cubic in FIG. 1, the ionic crystal 3 is not necessarily cubic.

Unlike an ionic liquid having a low melting point (for example, less than 100° C.), an ionic crystal is composed of a salt compound having a higher melting or decomposition point, and exhibiting properties characteristic of a crystal structure. The crystal structure of the ionic crystal may be determined by, for example, x-ray diffractometry.

The anionic component included in the ionic crystal has a specific structure containing a fluorine atom represented by formula (1) above. This is believed to lower the hygroscopicity of the ionic crystal to be formed together with a cationic component. The anionic component may have a structure represented by formula (1a) or (1b).

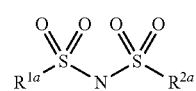
(1a)

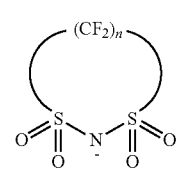
(1b)

In formula (1a), $R^{1a}$ and $R^{2a}$ each independently denote a fluorine atom or a fluoroalkyl group, and preferably denote a perfluoroalkyl group with a carbon number of from 1 to 4. n denotes an integer from 1 to 5, and preferably 2 or 3.

Specific examples of the anionic component include anions represented by any of formulas (2-1) to (2-7), and at least one selected from the group consisting of these anions is preferably contained.

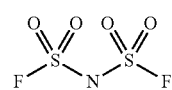
(2-1)

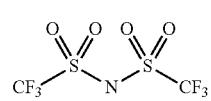
(2-2)

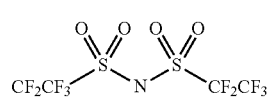
(2-3)

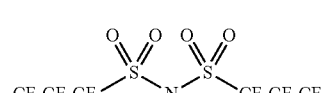
(2-4)

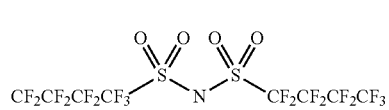
(2-5)

-continued

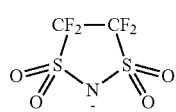

(2-6)

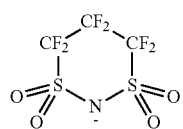

(2-7)

Any cationic component that may form an ionic crystal with the anionic component may be included in the ionic crystal, and the cationic component may be either inorganic or organic. The cationic component preferably absorbs less in the visible region. Examples of the inorganic cation include $Li^+$, $Na^+$, $K^+$, $Rb^+$, $Cs^+$, $Be^{2+}$, $Mg^{2+}$, $Ca^{2+}$, $Sr^+$, $Ba^{2+}$, $Sc^{3+}$, $Y^{3+}$, $Ti^{4+}$, $Zr^{4+}$, $Hf^+$, $V^{5+}$, $Nb^{5+}$, $Ta^{5+}$, $Zn^{2+}$, $Cd^{2+}$, $Hg^{2+}$, $Al^{3+}$, $Ga^{3+}$, $In^{3+}$, $Tl^{3+}$, $Sn^{4+}$, $Pb^{4+}$, $Bi^{3+}$, $La^{3+}$, $Ce^{3+}$, $Gd^{3+}$, $Yb^{3+}$, and $Lu^{3+}$, and at least one selected from the group consisting of these cations is preferably contained, more preferably at least one selected from the group consisting of the metals in groups 1 and 2 of the periodic table is contained, still more preferably at least one selected from the group consisting of $K^+$, $Rb^+$, and $Cs^+$ is contained, and particularly preferably at least one selected from the group consisting of $K^+$ and $Cs^+$ is contained.

The organic cation only needs to contain an organic group, and may be a carbon cation where the carbon atom is formally charged, or may be a hetero atom cation where the hetero atom, such as a nitrogen atom, a phosphorus atom, an oxygen atom, or a sulfur atom, is formally charged. Specific examples of the organic cation include those represented by any of formulas (3-1) to (3-15), and at least one selected from the group consisting of these cations is preferably contained.

(3-1)

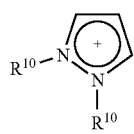

(3-2)

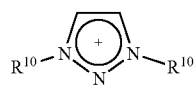

(3-3)

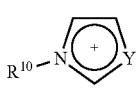

(3-4)

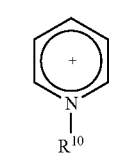

(3-5)

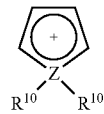

(3-6)

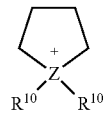

(3-7)

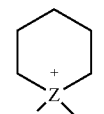

(3-8)

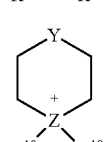

(3-9)

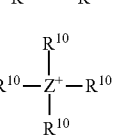

(3-10)

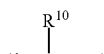

(3-11)

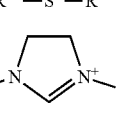

(3-12)

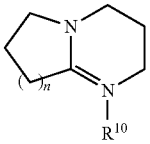

(3-13)

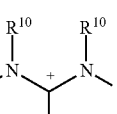

(3-14)

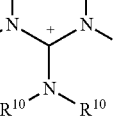

(3-15)

In the formula, Y denotes an oxygen atom or a sulfur atom. Z denotes a nitrogen atom or a phosphorus atom. $R^{10}$ each independently denote at least one substituent selected from the group consisting of an optionally substituted alkyl group, an optionally substituted alkenyl group, an optionally substituted alkynyl group, an optionally substituted aryl group, and an optionally substituted heterocycle group, or a hydrogen atom, or two $R^{10}$s each denote an alkylene group to be connected to each other to form a ring. Also, the aromatic ring and the aliphatic ring in the formula may have at least one of the substituents. n denotes an integer from 1 to 3.

The alkyl group, alkenyl group and alkynyl group in $R^{10}$ have a carbon number of, for example, 8 or less, and preferably 4 or less. Examples of the aryl group include a phenyl group and a naphthyl group. Examples of the heterocycle group include a pyridyl group, a quinolyl group, a furyl group, an imidazolium group, a pyridinium group, a pyrrolidinium group, and a piperidinium group. Examples of the substituents in $R^{10}$ include alkyl groups with a carbon number of 4 or less; alkoxy groups, such as a methoxy group and an ethoxy group; hydroxyl groups; amino groups; halogen atoms, such as a chlorine atom and a fluorine atom; and onium groups, such as an ammonium group and a phosphonium group.

Specific examples of $R^{10}$ include hydrogen atoms; alkyl groups with a carbon number of 4 or less, such as a methyl group, an ethyl group, an n-propyl group, an isopropyl group, an n-butyl group, an isobutyl group, a sec-butyl group, and a tert-butyl group; alkoxyalkyl groups with a carbon number of 4 or less, such as a methoxymethyl group, an ethoxymethyl group, and a 2-methoxyethyl group; and alkenyl groups with a carbon number of 4 or less, such as an allyl group.

The organic cation may be a cation represented by any of formulas (3-21) to (3-29), and more preferably at least one selected from the group consisting of these cations is contained.

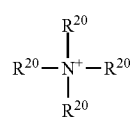 (3-20)

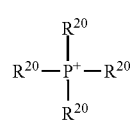 (3-21)

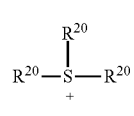 (3-22)

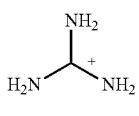 (3-23)

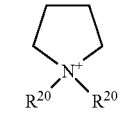 (3-24)

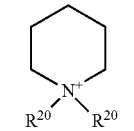 (3-25)

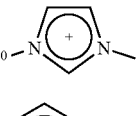 (3-26)

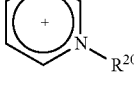 (3-27)

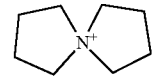 (3-28)

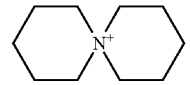 (3-29)

In the formula, $R^{20}$ each independently denotes a hydrogen atom, a methyl group, an ethyl group, an n-propyl group, an n-butyl group, or an allyl group.

The ionic crystal included in the light-emitting material includes an anionic component with a specific structure and a cationic component, and is a crystalline solid at normal temperatures. The ionic crystal has a melting point or decomposition point of, for example, 100° C. or more, above 100° C., 150° C. or more, or 250° C. or more. The melting point of the ionic crystal is measured by a differential scanning calorimeter. The decomposition point is a temperature corresponding to 1-weight loss % by thermogravimetric analysis (TGA).

The ionic crystal preferably undergoes no phase transition into a plastic crystal in the temperature range or lower than the temperature range in which the light-emitting material and the light-emitting device are produced and used, for example, 100° C. or less, preferably 150° C. or less, and more preferably 250° C. or less. Whether the ionic crystal has plasticity may be determined by the change in entropy of melting. In other words, the change in entropy of melting of the ionic crystal is preferably 20 $Jmol^{-1}K^{-1}$ or more. When the ionic crystal is a plastic crystal, rotational motions and dispersion of the ions forming the crystal are active, which tends to reduce gas barrier properties of the crystal against water and oxygen, for example.

Specific examples of the ionic crystal containing an anionic component represented by formula (1) include ionic crystals containing salt compounds shown in the table below. In the table, Me denotes a methyl group, Et denotes an ethyl group, Pr denotes an n-propyl group, and Bu denotes an n-butyl group.

TABLE 1

| Anion | Cation | Decomposition point (° C.) | Melting point (° C.) | Change in entropy of melting ($Jmol^{-1}K^{-1}$) |
|---|---|---|---|---|
| (2-7) | $K^+$ | 428 | 387 | 43.5 |
|  | $Rb^+$ | 421 | 337 | 52.0 |
|  | $Cs^+$ | 414 | 299 | 44.8 |
|  | $Pr_4N^+$ | 329 | 174 | 71.7 |
|  | $Bu_4N^+$ | 273 | 158 | 66.2 |
| (2-5) | $K^+$ | 354 | 342 | 35.1 |
|  | $Rb^+$ | 358 | 357 | — |
|  | $Cs^+$ | 362 | 359 | — |
|  | $Me_4N^+$ | 337 | dec. | — |
|  | $Me_4P^+$ | 343 | dec. | — |
| (2-4) | $K^+$ | 349 | 328 | 33.4 |
|  | $Rb^+$ | 357 | 334 | 36.1 |
|  | $Cs^+$ | 356 | 329 | 33.6 |
| (2-3) | $K^+$ | 369 | 271 | 31.4 |
|  | $Rb^+$ | 354 | 263 | 29.0 |
|  | $Cs^+$ | 366 | 250 | 29.9 |
| (2-2) | $K^+$ | 415 | 197 | 60.0 |
|  | $Rb^+$ | 408 | 176 | 56.2 |

Particularly preferable examples of the ionic crystal include ionic crystals containing at least one of the anionic components represented by formula (2-5) or (2-7) and at least one of the inorganic cations, such as alkali metals; or ionic crystals containing at least one of the anionic components represented by formula (2-5) or (2-7) and at least one of K⁺ and Cs⁺. Specific examples include ion crystals represented by any of formulas (4-1) to (4-4).

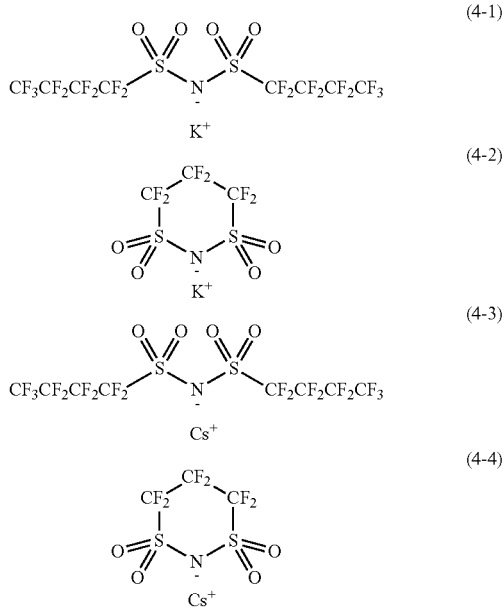

The luminescent nanoparticles to be included in the light-emitting material only need to emit light with a wavelength different from the wavelength of the excitation light in response to the light. Examples of the compound to be included in the luminescent nanoparticles include II-VI group compounds, such as ZnO, ZnS, ZnSe, ZnTe, CdS, CdSe, CdTe, CdSeS, and CdSeTe; III-VI group compounds, such as AlN, AlP, AlAs, AlSb, GaN, GaP, GaAs, GaSb, InN, InP, InAs, InSb, and InGaP; IV-VI group compounds, such as PbS and PbSe; single substances and compounds of IV group, such as C, Si, Ge, SiC, and SiGe; I-III-VI group compounds, such as $CuInS_2$, $CuInSe_2$, $CuGaxIn_{1-x}S_2$, $AgInS_2$, and $AgInSe_2$ (with the proviso that x denotes a number satisfying 0<x<1); perovskite compounds represented by $ABX_3$ (with the proviso that A denotes Cs⁺, Rb⁺, $CH_3N^+H_3$, and $N^+H_2=CHNH_2$, that B denotes $Pb^{2+}$ or $Sb^{2+}$, and that X denotes Cl⁻, Br⁻ or I), and at least one selected from the group consisting of these is preferable. More preferable examples of the compound include CdS, CdSe, CdTe, CdSeS, CdSeTe, InP, $AgInS_2$, $AgInSe_2$, $CsPbBr_3$, $CsPbI_3$, $CsPb(Br_xI_{1-x})_3$, $(CH_3NH_3)PbBr_3$, $(CH_3NH_3)PbI_3$, and $(CH_3NH_3)Pb(Br_xI_{1-x})_3$ (with the proviso that x denotes a number satisfying 0<x<1).

The luminescent nanoparticles may include a plurality of compounds. The luminescent nanoparticles may include, for example, at least two types of semiconductor compounds having different band-gap energies, or may have a core-shell structure, where a core compound is covered with another compound having a greater bandgap. In a core-shell structure, for example, the shell serves as a protective layer for the core. The shell may not be a single layer, and may have two or more layers. When the luminescent nanoparticles have two or more shell layers, the compound of an outer shell layer only needs to have a greater band-gap energy than that of an inner shell layer.

Configuration examples of core-shell luminescent nanoparticles, when expressed as a core compound/a shell compound, include CdS/ZnS, CdSe/ZnS, CdTe/ZnS, CdSeS/ZnS, CdSeTe/ZnS, CdSe/CdSeS/ZnS, InP/ZnS, $AgInS_2$/ZnS, and $AgInSe_2$/ZnS.

The luminescent nanoparticles have a shape selected as appropriate in accordance with the compound included therein. The luminescent nanoparticles may be, for example, spherical, plate-like, rod-shaped, or polyhedral.

The luminescent nanoparticles have an average particle diameter of, for example, from 1 nm to 100 nm, and preferably from 1 nm to 20 nm. When the luminescent nanoparticles have a core-shell structure, the average particle diameter is a value including the shell. The core itself has an average particle diameter of, for example, from 1 nm to 10 nm. When the core contains a perovskite compound, the average particle diameter is, for example, 90 nm or less.

The particle diameter of the luminescent nanoparticles may be obtained by, for example, using an image taken by a transmission electron microscope (TEM), and is the length of the longest line segment among the line segments connecting any two points on the periphery of a particle and lying inside the particle observed in a TEM image. However, for a rod-shaped particle, the length of the short axis is defined as the particle diameter. A rod-shaped particle as used herein is a particle having a short axis and a long axis orthogonal to the short axis with a ratio of the long axis to the short axis of greater than 1.2 in a TEM image. Examples of the rod-shaped particles include tetragonal (including rectangular), elliptical, and polygonal particles observed in a TEM image. The rod-shaped particles may have a cross-section, which is a plane orthogonal to the long axis, having, for example, a circular, elliptical, or polygonal shape. Specifically, in a rod-shaped particle with an elliptical cross-section, the length of the long axis is the longest line segment among the line segments connecting any two points on the periphery of the particle. In a rod-shaped particle with a rectangular or polygonal cross-section, the length of the long axis is the longest line segment among the line segments parallel to the longest side among the sides defining the periphery and connecting any two points on the periphery of the particle. The length of the short axis is the longest line segment among the line segments connecting any two points on the periphery of the particle and orthogonal to the line segment defining the length of the long axis.

The average particle diameter of the luminescent nanoparticles is observed by a TEM image at a magnification of from 50,000 to 150,000 x. In other words, the particle diameters of all the measurable particles are measured, and the measured particle diameters are averaged. The "measurable" particles as used herein refer to particles entirely observable in a TEM image. Thus, in a TEM image, particles partially not contained in the image taken area and observed as partially "cut" particles are not measurable. When a TEM image contains 100 or more measurable particles, their average particle diameter is obtained using the TEM image. When a TEM image contains less than 100 measurable particles, another TEM image is taken at a different site, and an average particle diameter is obtained by measuring and averaging the particle diameters of 100 or more measurable particles using the two or more TEM images.

The luminescent nanoparticles may each be surface-treated with an ionic surface modifier, and may have a modifying group on the particle surface. Being surface-modified may enable the luminescent nanoparticles to have more improved stability and more improved dispersibility into various media. The surface modifier preferably has an ionic functional group in the molecule. The ionic group may be either cationic or anionic, and preferably has at least a cationic group. For specific examples of the surface modifier and techniques of surface modification, refer to, for example, Yuki Taniguchi et al., A Versatile Surface Design to Disperse Nanoparticles in Ionic Liquids and Organic Solvents, Chemistry Letters, Vol. 45, pp 898-900, 2016. Preferable examples of the surface modifier are compounds having a cationic functional group containing a nitrogen atom, and the compounds represented by formula (5-1) or (5-2) are more preferable.

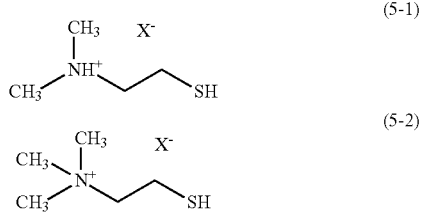

In the formula, $X^-$ denotes an anion, for example, a halogen anion, such as a fluorine ion, a chlorine ion, and a bromine ion, and may be an anion represented by formula (1).

The luminescent nanoparticles may be surface-treated with a nonionic surface modifier having a structure represented by formula (6), and may have a modifying group on the particle surfaces. By being surface-modified, the luminescent nanoparticles tend to have more improved stability and more improved dispersibility into various media.

In formula (6), $R^{30}$ denotes at least one substituent selected from the group consisting of a hydrogen atom, an optionally substituted alkyl group, an optionally substituted alkenyl group, an optionally substituted alkynyl group, and an optionally substituted aryl group. $R^{31}$ denotes at least one bivalent group selected from the group consisting of an optionally substituted alkylene group, an optionally substituted alkenylene group, an optionally substituted alkynylene group, and an optionally substituted arylene group. n is a number from 1 to 20. X denotes at least one substituent selected from the group consisting of a thiol group, a hydroxyl group, and an amino group.

The alkyl, alkenyl, and alkynyl groups in $R^{30}$ have a carbon number of, for example, 8 or less, preferably 6 or less, 4 or less, 3 or less, or 2 or less. The alkyl group has a carbon number of 1 or more, and the alkenyl group and the alkynyl group have a carbon number of 2 or more. The aryl group has a carbon number of, for example, from 6 to 10. Also, examples of the substituent in $R^{30}$ include alkyl groups or halogen atoms with a carbon number of 1 to 4.

Specific examples of $R^{30}$ include a hydrogen atom; alkyl groups with a carbon number of 8 or less, such as a methyl group, an ethyl group, an n-propyl group, an isopropyl group, a cyclopropyl group, an n-butyl group, an isobutyl group, a sec-butyl group, a tert-butyl group, a pentyl group, a hexyl group, a heptyl group, an octyl group, and an ethylhexyl group; alkenyl groups with a carbon number of 8 or less, such as a vinyl group, an allyl group, a butenyl group, a hexenyl group, and an octenyl group; and aryl groups, such as a phenyl group and a naphthyl group.

The alkylene group, alkenylene group and alkynylene group in $R^{31}$ have a carbon number of, for example, 8 or less, preferably 6 or less, 4 or less, 3 or less, or 2. The alkylene group has a carbon number of 1 or more, or 2 or more, and the alkenylene group and the alkynylene group have a carbon number of 2 or more. The arylene group has a carbon number of, for example, from 6 to 10. Examples of the substituent in $R^{31}$ include alkyl groups with a carbon number of 1 to 4 and halogen atoms.

Specific examples of $R^{31}$ include alkylene groups with a carbon number of 8 or less, such as a methylene group, an ethylene group, a propylene group, a 2-propylene group, a butylene group, a 1-methyl propylene group, a 2-methyl propylene group, a 1,1-dimethyl ethylene group, a 1,2-dimethyl ethylene group, a pentanediyl group, a hexanediyl group, and an octanediyl group; alkenylene groups, such as a propylenediyl group; and arylene groups, such as a phenylene group and a naphthalenediyl group.

n is preferably a number from 1 to 20, and may be a number from 1 to 10, from 2 to 10, or from 2 to 8. X denotes at least one substituent selected from the group consisting of a thiol group, a hydroxyl group, and an amino group, and preferably a thiol group or an amino group.

The nonionic surface modifier having a structure represented by formula (6) may contain, for example, an alkylene glycol structure, a polyalkylene glycol structure, an alkylene glycol monoalkyl ether structure, or a polyalkylene glycol monoalkyl ether structure. The nonionic surface modifier may contain, for example, an alkyleneoxy group with a carbon number of 2, 3, or 4 as a structural unit.

Particularly preferable examples of the nonionic surface modifier include nonionic surface modifiers containing at least one compound represented by formula (6-1) or (6-2).

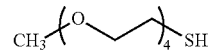

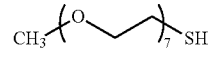

In surface-treating the luminescent nanoparticles with a surface modifier, the amount of the surface modifier to be used is, for example, 10% by mass or more, and preferably 100% by mass or more relative to the luminescent nanoparticles. The upper limit of the amount is, for example, 10000% by mass or less.

The percentage of the luminescent nanoparticles contained in the light-emitting material is, for example, from 0.01% by mass to 10% by mass, and preferably from 0.1% by mass to 5% by mass relative to the total mass of the light-emitting material.

The light-emitting material may be produced by, for example, a production method including a preparation step of preparing a solution in which the luminescent nanoparticles are dispersed and an anion and a cation for forming an ionic crystal are dissolved, and a precipitation step of precipitating an ionic crystal from the prepared solution. The production method may include after-treatment steps, such as a drying step and a purification step as appropriate after the precipitation step.

In the preparation step, a solution in which the luminescent nanoparticles are dispersed and an anion and a cation for forming an ionic crystal are dissolved is prepared. For the solvent, a non-aqueous solvent is preferable. Specific examples of the solvent include polar organic solvents including ketone solvents, such as acetone; nitrile solvents, such as acetonitrile; alcohol solvents, such as methanol;

amide solvents, such as N,N-dimethyl formamide; and sulfoxide solvents, such as dimethyl sulfoxide. The anion and cation for forming an ionic crystal may be those generated by dissolving a salt compound containing the anion and cation, or those generated by dissolving each of a salt compound containing the anion and a salt compound containing the cation in a solvent.

In the precipitation step, an ionic crystal is precipitated from the prepared solution through recrystallization or reprecipitation. This produces a light-emitting material in which the luminescent nanoparticles are at least partially incorporated in the ionic crystal. The recrystallization method may be selected as appropriate from the known methods including, for example, concentration of the solution by removal of the solvent, cooling of the solution, and addition of a poor solvent, and some of these methods may be combined. Examples of the reprecipitation method include mixing of the prepared solution and a poor solvent, and this can be specifically carried out by adding the prepared solution into a superabundant poor solvent. Examples of the poor solvent to be used for the recrystallization or reprecipitation include aliphatic hydrocarbon solvents, such as hexane and cyclohexane; aromatic hydrocarbon solvents, such as toluene; and halogenated hydrocarbon solvents, such as dichloromethane and chloroform.

Light-Emitting Device

The light-emitting device includes a light source having an emission peak wavelength in the range of from 380 nm to 485 nm, and the light-emitting material. The light-emitting device may further include other constituent members as appropriate. The light-emitting device including the light-emitting material may achieve superior long-term reliability. The light-emitting device may further include a member for covering the light source in addition to the light source and the light-emitting material.

For the light source, the one having an emission peak wavelength in the range of from 380 nm to 485 nm, which is a short wavelength region of visible light, is used. The light source has an emission peak wavelength of preferably from 420 nm to 485 nm, and more preferably from 440 nm to 480 nm. This enables efficient excitation of the light-emitting material, and effective use of visible light. Also, using a light source in that wavelength range may achieve a light-emitting device with a high emission intensity.

For the light source, a semiconductor light-emitting element (hereinafter also simply referred to as "light-emitting element") is preferably used. Using a semiconductor light-emitting element as the light source may achieve a highly efficient light-emitting device having a high linearity of output to input and high stability to mechanical impact. The light-emitting element may include at least one semiconductor layer selected from the group consisting of GaN, GaAs, InGaN, AlInGaP, GaP, SiC, and ZnO. A semiconductor light-emitting element that emits bluish-violet light, blue light, or ultraviolet rays preferably contains a nitride compound ($In_XAl_YGa_{1-X-Y}N$, $0 \leq X$, $0 \leq Y$, $X+Y \leq 1$) as a semiconductor layer.

The details of the light-emitting material to be included in the light-emitting device are as described above. The light-emitting material may be, for example, contained in a member covering the light source, or disposed on a member covering the light source. Being disposed above the light source allows the light-emitting material to partially absorb light emitted from the light source, and emit light with a longer wavelength. Also, having an emission peak wavelength in the range of from 380 nm to 485 nm allows the light source to use light emitted from the light source more effectively. In other words, this enables reduction in loss of light emitted from the light-emitting device, achieving a highly efficient light-emitting device. The amount of the light-emitting material in the light-emitting device may be selected as appropriate in accordance with, for example, the light source and the purpose.

The light-emitting device may include a fluorescent material as appropriate in addition to the light-emitting material. The fluorescent material only needs to partially absorb light emitted from the light source, and converts the wavelength of the light to a different wavelength from that of the light-emitting material. The fluorescent material may be contained, for example, in a member for covering the light source in the light-emitting device. Containing a fluorescent material allows the light-emitting device to have various color tones.

Examples of the fluorescent material include nitride fluorescent materials, oxynitride fluorescent materials, and sialon fluorescent materials that are mainly activated by a lanthanoid element such as Eu or Ce; alkaline earth halogen apatite fluorescent materials, alkaline earth metal halogen borate fluorescent materials, alkaline earth aluminate fluorescent materials, alkaline earth silicate, alkaline earth sulfide, alkaline earth thiogallate, alkaline earth silicon nitride, germanate, and fluoride complexes that are mainly activated by a lanthanoid element such as Eu, or a transition metal element such as Mn; rare earth aluminate, and rare earth silicate that are mainly activated by a lanthanoid element such as Ce; and inorganic and organic complexes that are mainly activated by a lanthanoid element such as Eu.

Specific examples of the fluorescent material include $(Ca,Sr,Ba)_2SiO_4$:Eu, $(Y,Gd)_3(Ga,Al)_5O_{12}$:Ce, $(Si,Al)_6(O,N)_8$:Eu(β-sialon), $SrGa_2S_4$:Eu, $(Ca,Sr)_2Si_5N_8$:Eu, $CaAlSiN_3$:Eu, $(Ca,Sr)AlSiN_3$:Eu, $Lu_3Al_5O_{12}$:Ce, $(Ca,Sr,Ba,Zn)_8MgSi_4O_{16}(F,Cl,Br,I)_2$:Eu, $K_2(Si,Ti,Ge)F_6$:Mn, and $3.5MgO \cdot 0.5MgF_2 \cdot GeO_2$:Mn, and at least one selected from the group consisting of these is preferably contained.

The member for covering the light source contains, for example, at least one resin. The resin may be any of a thermoplastic resin, a thermosetting resin, and a photo-curable resin. Specific examples of the thermosetting resin include an epoxy resin and a silicone resin. Specific examples of the photo-curable resin include a silicone resin. The member for covering the light source may include the light-emitting material and the fluorescent material in addition to the resin, and may further include other components as appropriate. Examples of the other components include a filler, such as silica, barium titanate, a titanium oxide, and an aluminum oxide; a light stabilizer; and a coloring agent. When the fluorescent member contains, for example, a filler as the other components, the amount of the filler relative to the resin may be from 0.01% by mass to 20% by mass.

Figure 2:
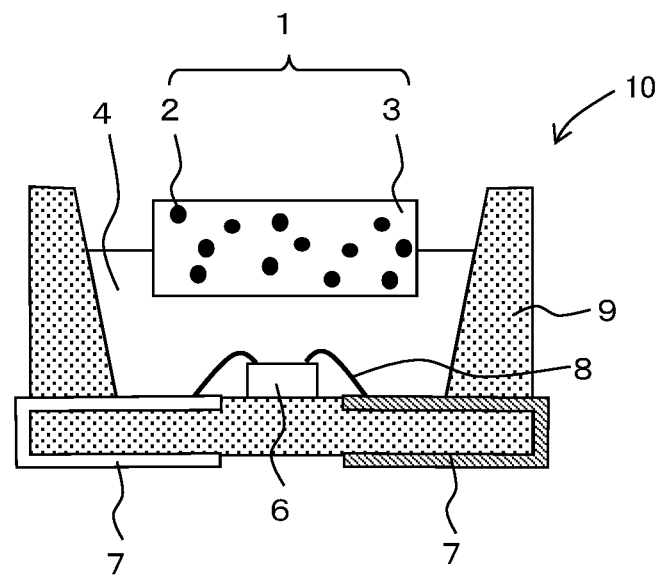
FIG. 2 is a schematic cross-sectional view of an example light-emitting device.
Figure 3:
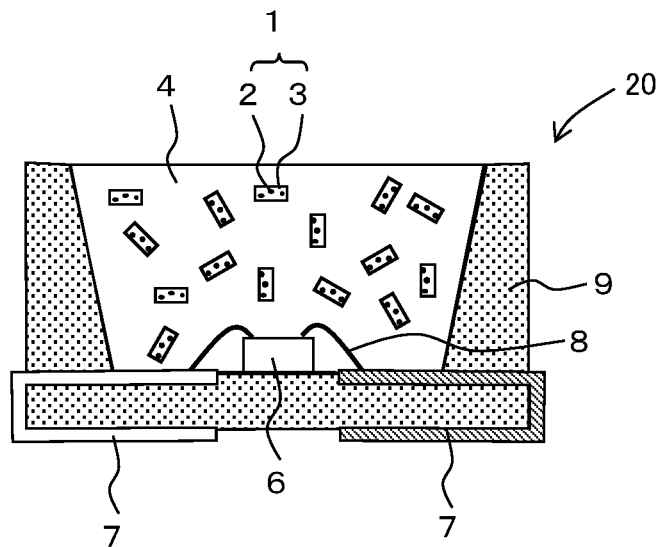
FIG. 3 is schematic cross-sectional view of another example light-emitting device.

Examples of the light-emitting device 10 according to the present embodiment will now be described with reference to FIGS. 2 and 3. FIGS. 2 and 3 are schematic cross-sectional views of the light-emitting devices 10 and 20, respectively, both of which are examples of surface mount light-emitting devices. The light-emitting devices 10 and 20 each include a light-emitting element 6 having an emission peak wavelength in the range of from 440 nm to 480 nm and a molded body 9 on which the light-emitting element 6 is disposed, and emits light at short wavelengths of visible light (for example, in the range of from 380 nm to 485 nm). The molded body 9 is composed of leads 7 and a resin portion, which are integrally formed. The molded body 9 has a recess defined by the bottom surface and side surfaces, and the light-emitting element 6 is disposed on the bottom surface of the recess. The light-emitting element 6 has a pair of negative and positive electrodes, and the pair of negative and positive electrodes are electrically connected through the leads 7 and wires 8. The light-emitting element 6 is covered with a covering member 4, which includes a resin. In the light-emitting device 10 of FIG. 2, the light-emitting material 1 containing the luminescent nanoparticles 2 and an ionic crystal 3 is disposed on the surface of the covering member 4 with at least a part of the light-emitting material 1 being embedded in the covering member 4. In the light-emitting device 20 of FIG. 3, the light-emitting materials 1 each containing the luminescent nanoparticles 2 and the ionic crystal 3 are incorporated in the covering member 4.

The covering member 4 not only serves as a member for protecting the light-emitting element 10 from the outside environment, but may convert the wavelength of light emitted by the light-emitting element 6. In FIG. 3, the light-emitting materials 1 are mixed in the entire covering member 4 approximately uniformly. This enables emission of light with much less color unevenness. The light-emitting materials 1 may also be unevenly located in the covering member 4. For example, the light-emitting materials 1 when disposed closer to the light-emitting element 10 may efficiently convert the wavelength of light from the light-emitting element 10, achieving a light-emitting device with a superior luminescent efficiency. Also, in consideration of the impact of heat on the light-emitting materials 1, the light-emitting element 6 and the light-emitting materials 1 may be spaced apart from each other in the covering member 4.

Figure 4:
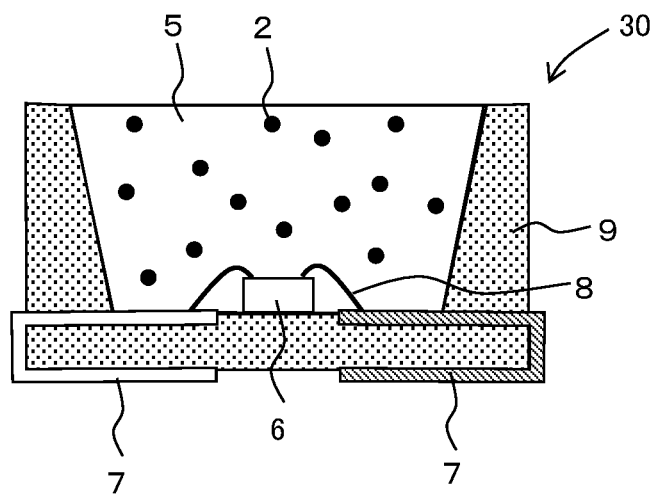
FIG. 4 is a schematic cross-sectional view of yet another example light-emitting device.

FIG. 4 is a schematic cross-sectional view of a light-emitting device 30 according to a conventional art. In the light-emitting device 30, the luminescent nanoparticles 2 are directly dispersed in a covering member 5 including a resin.

The light-emitting device may be used for, for example, lighting equipment; display units, and monitors, such as radar; and for a light source in liquid crystal display units.

EXAMPLES

The present disclosure will now be described in detail by way of Examples; however, the present disclosure is not limited to these Examples.

Example 1: Preparation of Light-Emitting Material by Recrystallization Method As a liquid dispersion of luminescent nanoparticles, 0.2 ml of a liquid dispersion of CdSe/ZnS in toluene (emission maximum: 630 nm, luminescent nanoparticle content: 1.7% by mass) was used. According to the method described in Chemistry Letters, Vol. 45, pp 898-900, 2016, the surfaces of CdSe/ZnS nanoparticles were modified with 2-dimethylaminoethanethiol hydrochloride. The resultant particles were then dispersed in 0.6 ml of (2-methacryloyloxyethyl) trimethylammonium bis(trifluoromethanesulfonyl)imide (CAS No. 676257-10-6), or a polymerizable ionic liquid, to obtain a dispersion containing the luminescent nanoparticles in the ionic liquid in an amount of 0.34% by mass.

To 100 µl of the above ionic liquid in which CdSe/ZnS nanoparticles were dispersed, 250 µl of methanol was added and mixed well, and then centrifuged. After removal of the supernatant, to the precipitated nanoparticles, 100 µl of acetone in which 50 mg of potassium cyclohexafluoropropane-1,3-bis(sulfonyl)imide (CAS No. 588668-97-7) had been dissolved was added and dispersed. To this, 250 µl of methanol was added and mixed well, and then centrifuged. After removal of the supernatant, to the precipitated nanoparticles, 60 µl of acetone in which 50 mg of potassium cyclohexafluoropropane-1,3-bis(sulfonyl)imide had been dissolved was added again to obtain a mother solution in which the luminescent nanoparticles were dispersed (0.51% by mass) and a salt compound for forming an ionic crystal was dissolved (51% by mass).

The resultant mother solution was concentrated by slowly volatilizing acetone over 11 days under a nitrogen atmosphere to precipitate a crystal. The precipitated crystal was washed with a saturated solution of potassium cyclohexafluoropropane-1,3-bis(sulfonyl)imide in acetone, and dried to obtain a light-emitting material containing an ionic crystal in which the luminescent nanoparticles were incorporated as an orange colored crystal of about 4 mm×3 mm.

Example 2: Preparation of Light-Emitting Material by Reprecipitation Method

To 50 µl of the dispersion of the luminescent nanoparticles in an ionic liquid prepared in Example 1, 250 µl of methanol was added and mixed well, and then centrifuged. After removal of the supernatant, to the precipitated nanoparticles, 100 µl of acetone in which 50 mg of potassium cyclohexafluoropropane-1,3-bis(sulfonyl)imide had been dissolved was added and dispersed. To this, 250 µl of methanol was added and mixed well, and then centrifuged. After removal of the supernatant, to the precipitated nanoparticles, 60 µl of acetone in which 50 mg of potassium cyclohexafluoropropane-1,3-bis(sulfonyl)imide had been dissolved was added and dispersed. The resultant liquid dispersion was added dropwise to 1 ml of cyclohexane under stirring with a magnetic stirrer to precipitate a crystal. After removal of the supernatant, the precipitate was dried to obtain a light-emitting material containing an ionic crystal incorporating the luminescent nanoparticles in an amount of 0.25% by mass as an orange-colored powdery crystal. The precipitated crystal was washed with a saturated solution of potassium cyclohexafluoropropane-1,3-bis(sulfonyl)imide in acetone, and dried to obtain a light-emitting material containing an ionic crystal in which the luminescent nanoparticles were incorporated as an orange-colored powdery crystal.

Example 3: Preparation of Light-Emitting Device

A molded body having a recess with a surface mount blue light-emitting diode (main emission wavelength: 448 nm) being disposed on the bottom surface thereof was prepared. Into the recess, a photo-curable silicone resin (KER-4130M-UV by Shinetsu Silicone) was filled, and the light-emitting material obtained in Example 1 was mounted on the resin surface. The resin was then cured under predetermined conditions to prepare a light-emitting device as shown in FIG. 2.

Example 4

The powdery light-emitting material obtained in Example 2 was mixed into a photo-curable silicone (KER-4130M-UV by Shinetsu Silicone) to obtain a resin composition. The resultant resin composition was filled into a molded body having a recess with a surface mount blue light-emitting diode (main emission wavelength: 448 nm) being disposed on the bottom surface thereof. The resin was then cured under predetermined conditions to prepare a light-emitting device as shown in FIG. 3.

Comparative Example 1

To 10 µl of the dispersion of the luminescent nanoparticles in an ionic liquid prepared in Example 1, (2-methacryloyloxyethyl)trimethylammonium bis(trifluoromethanesulfonyl)imide, diethyleneglycol dimethacrylate, and 2-hydroxy-2-methylpropiophenone were added to obtain a polymerizable composition containing the luminescent nanoparticles in an amount of 0.09% by mass, (2-methacryloyloxyethyl)trimethylammonium bis(trifluoromethanesulfonyl)imide in an amount of 87% by mass, diethyleneglycol dimethacrylate in an amount of 12% by mass, and 2-hydroxy-2-methylpropiophenone in an amount of 0.4% by mass. The resultant polymerizable composition was filled into a molded body having a recess with a surface mount blue light-emitting diode (main emission wavelength: 448 nm) being disposed on the bottom surface thereof. This was then UV polymerized under predetermined conditions to obtain a light-emitting device as shown in FIG. 4.

Evaluation of Environmental Resistance

The light-emitting devices of Example 3 and Comparative Example 1 obtained above were subjected to durability evaluation in the manner described below. For the measurement of emission spectra, MK350N PLUS by UPRtec was used. Emission spectra of the light-emitting devices were measured immediately after their preparation. Subsequently, under the atmospheric air, the light-emitting devices were held in a thermostat at 85° C. for a predetermined time, and then a test of measuring their emission spectra was repeated for a predetermined number of times. For each of the resultant emission spectra, the area of from 550 nm to 700 nm was obtained, which was determined as each emission intensity. Relative emission intensities were obtained from the equation below, where t denotes a total retention time in the thermostat at 85° C., and relative emission intensities against time t were plotted. The results are shown in FIG. 5.

(Relative emission intensity)=(Emission intensity at time $t$)/(emission intensity at time 0)

Figure 5:
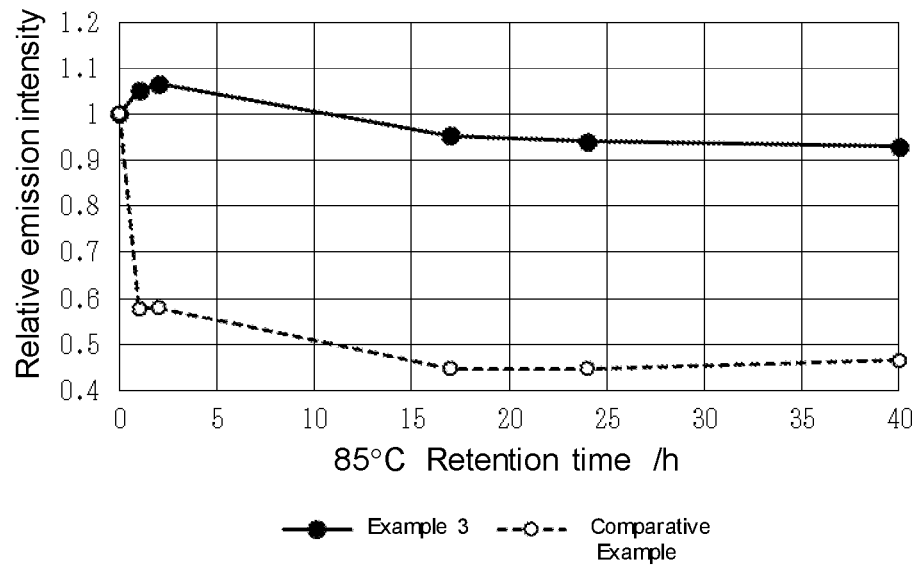
FIG. 5 is a graph showing changes over time of relative emission intensity in an environmental resistance test of light-emitting devices.

FIG. 5 shows changes over time in relative emission intensity at 85° C. of the light-emitting devices of Example 3 and Comparative Example 1. The light-emitting devices of Example 3 and Comparative Example 1 both include luminescent nanoparticles having the same cores and shells, and the same modifying group but different media around the luminescent nanoparticles. The light-emitting device of Example 3 has less emission attenuation than Comparative Example 1. This indicates that the ionic crystal of the Example has gas barrier properties against the atmospheric air, and thus the light-emitting material containing the ionic crystal incorporating the luminescent nanoparticles has improved environmental resistance.

Evaluation of Hygroscopicity

The ionic crystals used in the preparation of the light-emitting materials were evaluated for hygroscopicity in the manner below. For the samples, potassium bis(nonafluorobutanesulfonyl)imide (CAS No. 129135-87-1) was used as Example 5, potassium cyclohexafluoropropane-1,3-bis(sulfonyl)imide as Example 6, and sodium chloride (NaCl) as Comparative Example 2.

A dish having a diameter of 90 mm and a height of 10 mm and containing 50 ml of water was disposed at the center of a beaker with a diameter of 170 mm and a height of 270 mm. 50 mg of each sample having been ground well in a mortar was put into a polystyrene plate of 25 mm×25 mm in a manner to be thinly and uniformly spread, and the plates were disposed in the beaker in a manner to contact with the outer circumference of the dish. After covering the mouth of the beaker with aluminium foil, the beaker was subjected to a moisture absorption test at room temperature for a predetermined elapse of time to measure the infrared absorption spectra of the samples.

Figure 6:
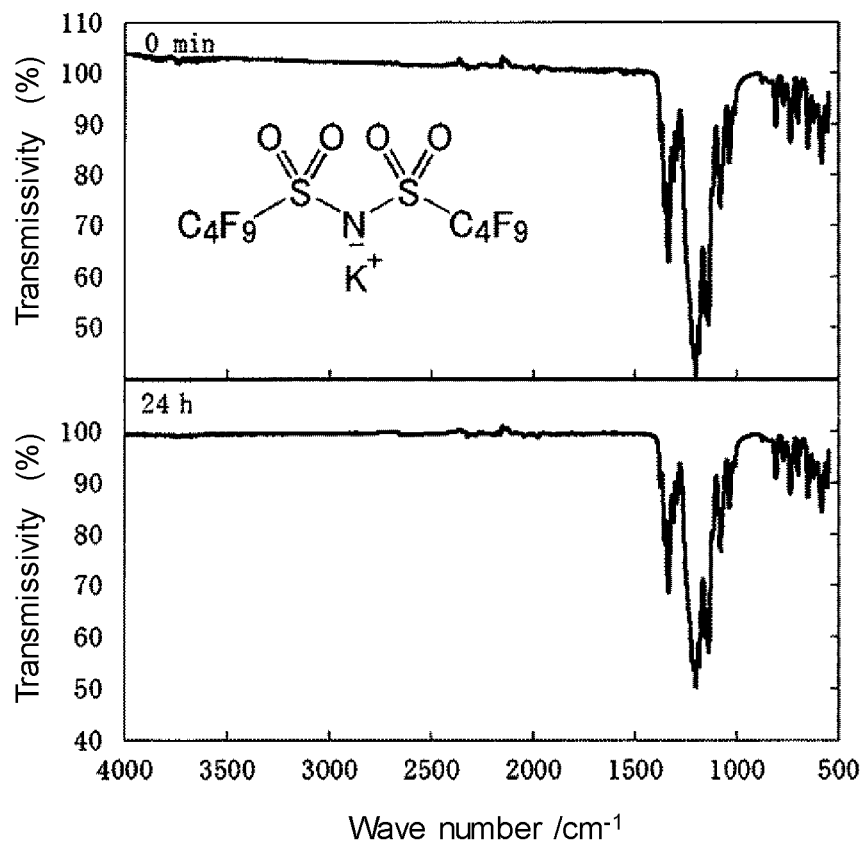
FIG. 6 is a graph showing changes in infrared absorption spectrum of Example 5.
Figure 7:
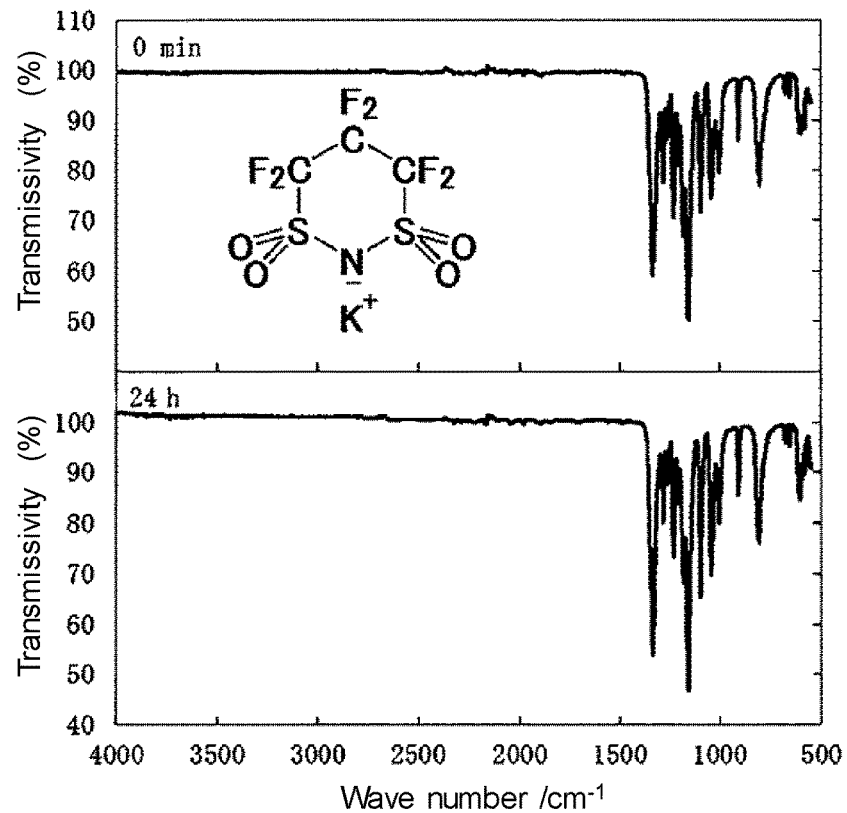
FIG. 7 is a graph showing changes in infrared absorption spectrum of Example 6.
Figure 8:
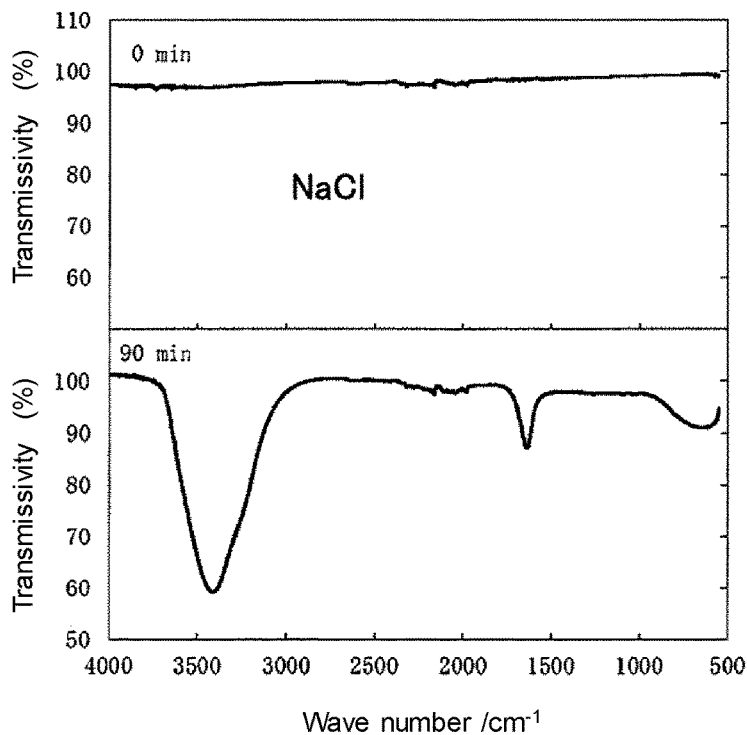
FIG. 8 is a graph showing changes in infrared absorption spectrum of Comparative Example 2.

The results are shown in FIG. 6. FIG. 6 shows infrared absorption spectra of potassium bis(nonafluorobutanesulfonyl)imide before the moisture absorption test and after 24 hours of the moisture absorption test. FIG. 7 shows infrared absorption spectra of potassium cyclohexafluoropropane-1,3-bis(sulfonyl)imide before the moisture absorption test and after 24 hours of the moisture absorption test. FIG. 8 shows infrared absorption spectra of sodium chloride before the moisture absorption test and after 90 min of the moisture absorption test.

For sodium chloride, absorption was observed after 90 min at 3400 cm$^{-1}$. This indicates that the absorption was caused by the OH group, and that NaCl absorbed moisture. For both potassium bis(nonafluorobutanesulfonyl)imide and potassium cyclohexafluoropropane-1,3-bis(sulfonyl)imide, no change was observed in their infrared absorption spectra after 24 hours, indicating that these ionic crystals have low hygroscopicity. Thus, using the ionic crystals of these Examples may reduce water vapor approaching the luminescent nanoparticles. Thus, a light-emitting material containing such an ionic crystal, which incorporates the luminescent nanoparticles, is believed to exhibit improved environmental resistance.

Example 7

5.16 g of lithium bis(nonafluorobutanesulfonyl)imide was dissolved in 25 ml of water. To this, a solution obtained by dissolving 1.87 g of cesium bromide in 5 ml of water was added dropwise. This was stirred for 30 min at room temperature, and the precipitated solid was filtered, washed with water, and dried to obtain 6.02 g of cesium bis(nonafluorobutanesulfonyl)imide.

To 0.1 ml of a liquid dispersion of CdSe/ZnS in toluene (emission maximum: 630 nm, the percentage of the luminescent nanoparticles: 1.7% by mass), 0.15 ml of toluene and 0.09 ml of methanol were added, and centrifuged. After removal of the supernatant, to the precipitated nanoparticles, 0.8 ml of chloroform was added and dispersed. This was added to a solution obtained by dissolving 72.5 mg of O-(2-mercaptoethyl)-0'-methyl-hexa(ethyleneglycol) (CAS No. 651042-82-9) in 0.4 ml of methanol. This was stirred at 30° C. for 186 hours to obtain a liquid dispersion of the luminescent nanoparticles surface-modified with O-(2-mercaptoethyl)-0'-methyl-hexa(ethyleneglycol).

To 120 µl of the liquid dispersion of the surface modified luminescent nanoparticles, 360 µl of cyclohexane was added, and centrifuged. After removal of the supernatant, to the precipitated nanoparticles, a solution obtained by dissolving 50 mg of cesium bis(nonafluorobutanesulfonyl)imide in 33 µl of a mixed solvent of acetone and methanol at a volume ratio of 1:1 was added to disperse the nanoparticles. The resultant liquid dispersion was added dropwise to 1.5 ml of cyclohexane under stirring with a magnetic stirrer to precipitate a crystal. After removal of the supernatant, the precipitate was dried to obtain a light-emitting material containing an ionic crystal incorporating the luminescent nanoparticles in an amount of 0.28% by mass as an orange-colored powdery crystal.

Example 8

A light-emitting device was prepared in the same manner as in Example 4 except that the powdery light-emitting material obtained in Example 7 was used.

Figure 9:
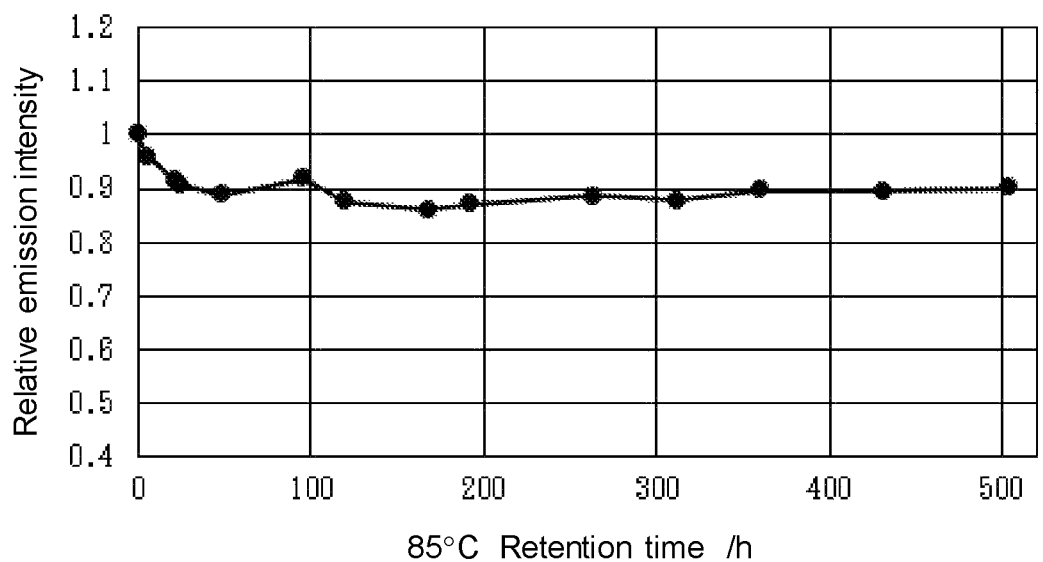
FIG. 9 is a graph showing changes over time of relative emission intensity in an environmental resistance test of the light-emitting device of Example 8.

The light-emitting device obtained in Example 8 was evaluated for environmental resistance. The results are shown in FIG. 9. The light-emitting device was also evaluated for environmental resistance in the same manner after having been held in a thermo-hygrostat at 60° C. and a humidity of 90% for a predetermined time instead of having been held in the thermostat at 85° C. for a predetermined time. The results are shown in FIG. 10.

FIG. 9 shows that the light-emitting device of Example 8 has improved environmental resistance compared with the light-emitting device of Comparative Example 1 shown in FIG. 5.

Figure 10:
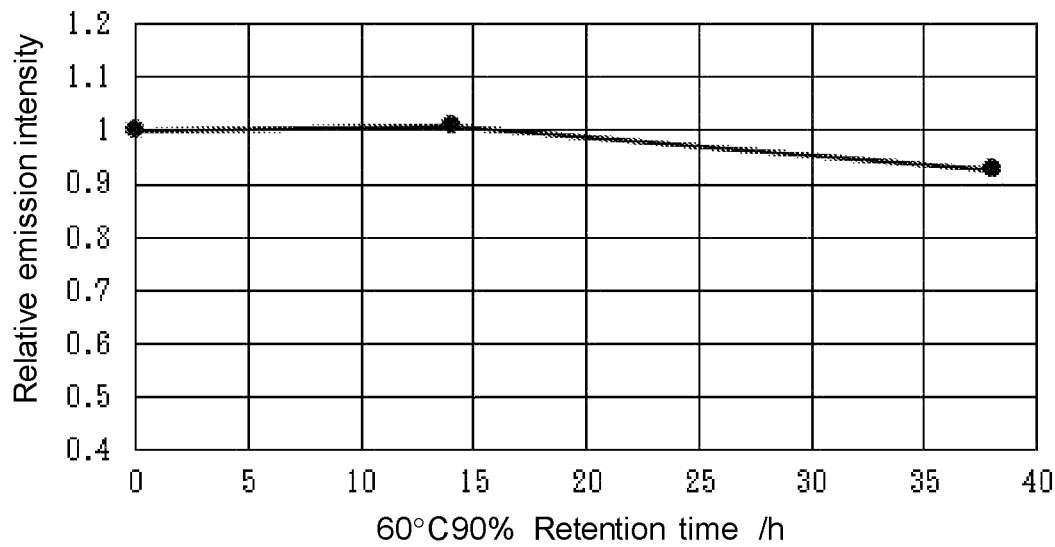
FIG. 10 is a graph showing changes over time of relative emission intensity in an environmental resistance test of the light-emitting device of Example 8.

FIG. 10 demonstrates that the light-emitting device of Example 8 maintains environmental resistance in a high humidity environment as well.

Evaluation of Hygroscopicity

Example 9

Figure 11:
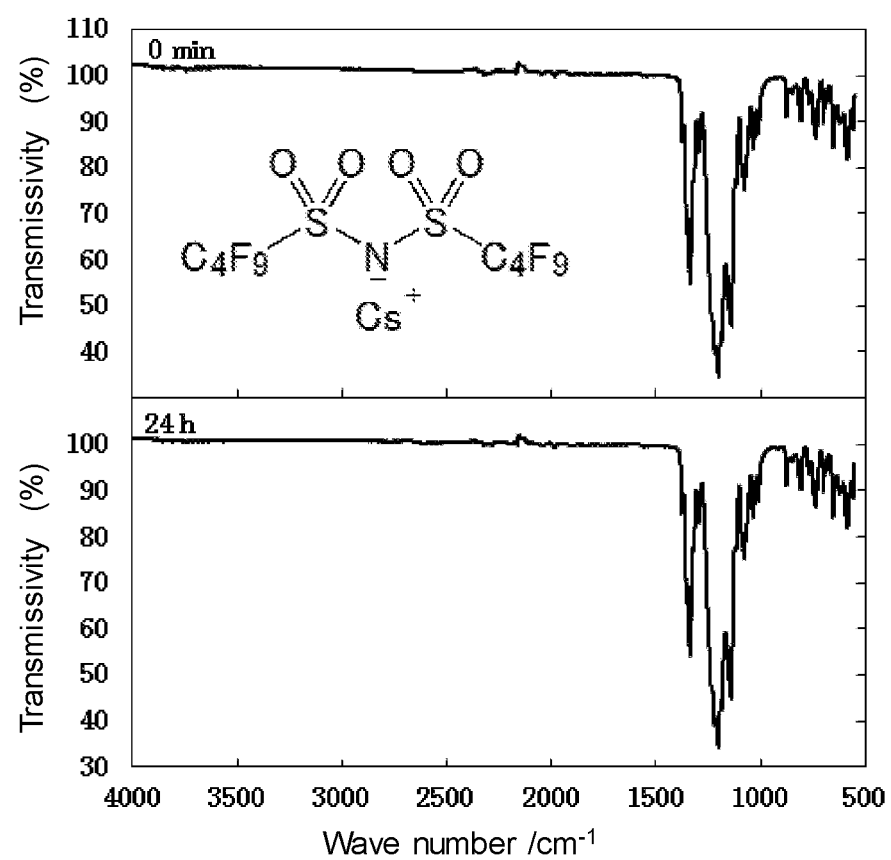
FIG. 11 is a graph showing changes in infrared absorption spectrum of Example 9.

Cesium bis(nonafluorobutanesulfonyl)imide, which was used for the preparation of the light-emitting material of Example 7, was evaluated as Example 9 for hygroscopicity. The results are shown in FIG. 11.

Cesium bis(nonafluorobutanesulfonyl)imide showed no change in its infrared absorption spectrum after 24 hours like Example 5 or 6, demonstrating that these ionic crystals have low hygroscopicity.

All pieces of literature, patent applications, and technical standards cited herein are incorporated herein by reference in their entireties.

The invention claimed is:

1. A light emitting material comprising:
   luminescent nanoparticles; and
   an ionic crystal containing an anionic component represented by formula (1) below:

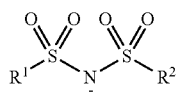
(1)

wherein $R^1$ and $R^2$ each independently denote a fluorine atom or a fluoroalkyl group, or $R^1$ and $R^2$ each denote a fluoroalkylene group to be connected to each other to form a ring.

2. The light emitting material according to claim 1, wherein the ionic crystal contains at least one anionic component represented by any of formulas (2-1) to (2-7) below:

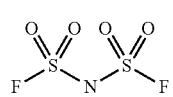
(2-1)

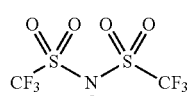
(2-2)

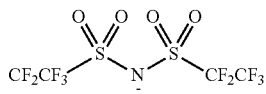
(2-3)

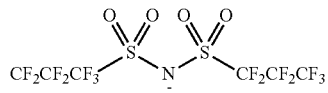
(2-4)

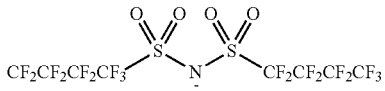
(2-5)

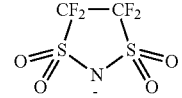
(2-6)

(2-7)

3. The light emitting material according to claim 1, wherein the ionic crystal contains at least one cation component selected from the group consisting of $Li^+$, $Na^+$, $K^+$, $Rb^+$, $Cs^+$, $Be^{2+}$, $Mg^{2+}$, $Ca^{2+}$, $Sr^{2+}$, $Ba^{2+}$, $Se^{3+}$, $Y^{3+}$, $Ti^{4+}$, $Zr^{4+}$, $Hf^{4+}$, $V^{5+}$, $Nb^{5+}$, $Ta^{5+}$, $Zn^{2+}$, $Cd^{2+}$, $Hg^{2+}$, $Al^{3+}$, $Ga^{3+}$, $In^{3+}$, $Tl^{3+}$, $Sn^{4+}$, $Pb^{4+}$, $Bi^{3+}$, $La^{3+}$, $Ce^{3+}$, $Gd^{3+}$, $Yb^{3+}$, and $Lu^{3+}$.

4. The light emitting material according to claim 1, wherein the ionic crystal contains at least one cation component selected from the group consisting of $K^+$, $Rb^+$, and $Cs^+$.

5. The light emitting material according to claim 1, wherein the ionic crystal contains at least one cation component represented by any of formulas (3-1) to (3-15) below:

(3-1)

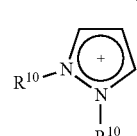
(3-2)

(3-3)

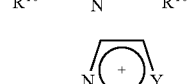
(3-4)

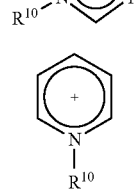
(3-5)

-continued

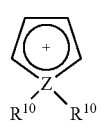
(3-6)

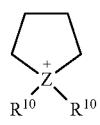
(3-7)

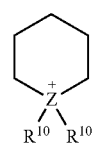
(3-8)

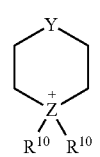
(3-9)

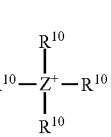
(3-10)

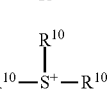
(3-11)

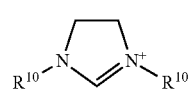
(3-12)

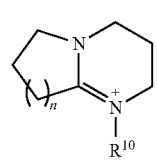
(3-13)

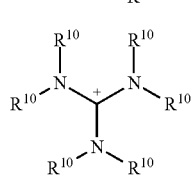
(3-14)

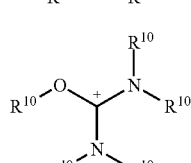
(3-15)

wherein:
Y denotes an oxygen atom or a sulfur atom; Z denotes a nitrogen atom or a phosphorus atom;
$R^{10}$ each independently denotes at least one substituent selected from the group consisting of an optionally substituted alkyl group, an optionally substituted alkenyl group, an optionally substituted alkynyl group, an optionally substituted aryl group, and an optionally substituted heterocycle group, or a hydrogen atom, or two $R^{10}$s each denote an alkylene group to be connected to each other to form a ring; and
n is an integer from 1 to 3.

6. The light emitting material according to claim 2, wherein the ionic crystal contains at least one anionic component represented by formula (2-5) or (2-7) and at least one of $K^+$ and $Cs^+$.

7. The light emitting material according to claim 1, wherein the luminescent nanoparticles are surface-treated with an ionic surface modifier.

8. The light emitting material according to claim 7, wherein the ionic surface modifier has a cationic functional group.

9. The light emitting material according to claim 7, wherein the ionic surface modifier contains at least one compound represented by formula (5-1) or (5-2),

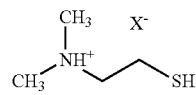
(5-1)

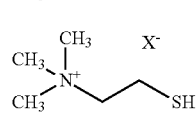
(5-2)

wherein X— denotes an anion.

10. The light emitting material according to claim 1, wherein the luminescent nanoparticles are surface-treated with a nonionic surface modifier represented by formula (6) below, $$R^{30}-(OR^{31})_n-X \quad (6)$$

wherein $R^{30}$ denotes at least one substituent selected from the group consisting of a hydrogen atom, an optionally substituted alkyl group, an optionally substituted alkenyl group, an optionally substituted alkynyl group, and an optionally substituted aryl group; $R^{31}$ is at least one divalent group selected from the group consisting of an optionally substituted alkylene group, an optionally substituted alkenylene group, an optionally substituted alkynylene group, and an optionally substituted arylene group; n is a number from 1 to 20; and X is at least one substituent selected from the group consisting of a thiol group, a hydroxyl group, and an amino group.

11. The light emitting material according to claim 1, wherein the nonionic surface modifier contains at least one compound represented by formula (6-1) or (6-2) below:

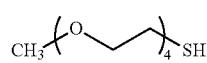
(6-1)

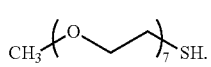
(6-2)

12. The light emitting material according to claim 1, wherein the ionic crystal at least partially incorporates the luminescent nanoparticles.

13. A light emitting device including a light source having an emission peak wavelength in a range of from 380 nm to 485 nm, and the light emitting material according to claim 1.

* * * * *